United States Patent
Chen et al.

(10) Patent No.: US 6,710,358 B1
(45) Date of Patent: Mar. 23, 2004

(54) APPARATUS AND METHOD FOR REDUCING ENERGY CONTAMINATION OF LOW ENERGY ION BEAMS

(75) Inventors: Jiong Chen, San Jose, CA (US); Peiching Ling, San Jose, CA (US)

(73) Assignee: Advanced Ion Beam Technology, Inc., Sunnyvale, CA (US)

(*) Notice: Subject to any disclaimer, the term of this patent is extended or adjusted under 35 U.S.C. 154(b) by 8 days.

(21) Appl. No.: 09/513,396

(22) Filed: Feb. 25, 2000

(51) Int. Cl.[7] .............................. G21K 5/10; H01J 37/05
(52) U.S. Cl. ................................................. 250/492.21
(58) Field of Search .................................. 250/492.21

(56) References Cited

U.S. PATENT DOCUMENTS

| | | | | |
|---|---|---|---|---|
| 4,634,331 A | * | 1/1987 | Hertel | 414/217 |
| 5,311,028 A | * | 5/1994 | Glavish | 250/492.21 |
| 5,883,391 A | * | 3/1999 | Adibi et al. | 250/492.21 |
| 5,932,882 A | * | 8/1999 | England et al. | 250/492.21 |
| 6,111,260 A | * | 8/2000 | Dawson et al. | 250/492.21 |
| 6,489,622 B1 | * | 12/2002 | Chen et al. | 250/492.21 |

* cited by examiner

*Primary Examiner*—John R. Lee
*Assistant Examiner*—Paul M. Gurzo
(74) *Attorney, Agent, or Firm*—Bo-In Lin

(57) ABSTRACT

An ion implantation method for reducing energy contamination in low energy beams is disclosed in this invention. The ion implantation method requires the use of a target chamber for containing a target for implantation in vacuum and an ion source chamber with an ion source for generating an ion beam. A means for conducting a mass analysis of the ion beam, such as an analyzer magnet, is also needed. The ion source chamber includes a beam deceleration optics that includes a beam deceleration means for decelerating the ion beam for producing a low energy ion beam. The beam deceleration optics further includes a beam steering means for generating an electrostatic field for steering the ion beam to a targeted ion-beam direction and separating neutralized particles from the ion beam by allowing the neutralized particles to transmit in a neutralized-particle direction slightly different from the targeted ion-beam direction. The ion beam steering means further includes a beam stopper for blocking said neutralized particles from reaching said target of implantation that minimizes energy contamination from high energy neutralized particles.

20 Claims, 4 Drawing Sheets

APPARATUS AND METHOD FOR REDUCING ENERGY CONTAMINATION OF LOW ENERGY ION BEAMS

BACKGROUND OF THE INVENTION

1. Field of the Invention

The invention disclosed herein relates generally to ion implantation methods employed in the manufacturing process of semiconductor devices. Specifically, this invention relates to an improved implantation process for manufacturing semiconductor devices that include shallow p-type or n-type regions by delivering ultra low energy (0.2 to 20 keV) ion beams to targets by employing an improved ion implantation method.

2. Description of the Prior Art

As semiconductor device dimensions continue to shrink source-drain junction depths are reduced accordingly. Shallow junction formation is, however, fast becoming one of the major limiting factors in the modern semiconductor fabrication process. To those skilled in the art of maling modern Ultra Large-Scale Integrated (ULSI) circuits conventional ion implantation methods do not provide production worthy solutions to the semiconductor industry.

A technology roadmap presented by Saito in IIT'98 [International Conference on Ion Implantation Technology, Kyoto, Japan, 1998]) indicates that sub-keV implantation energy is required for the 0.15 $\mu$m and below technology nodes. For example, 0.5 keV boron ions are used for 0.13 $\mu$m devices and 0.2 keV for 0.1 $\mu$m devices. Conventional implantation systems are unable to provide production worthy beam currents at energies below 2 keV because of space-charge beam blow up (i.e. divergence) associated with low energy beams.

One method that is used to achieve high beam currents at energies below 2 keV involves extraction of ions at higher energies than that desired, followed by a mass analysis, and then the ions are decelerated just before they reach the targets [J. G. England, et al., U.S. Pat. No. 5,969,366: Ion Implanter With Post Mass Selection Deceleration, 1999]. One problem with this method, however, is that neutralization of ions prior to deceleration may occur in the region between the mass analyzer and the deceleration electrodes when the ions interact with residual gases in the beam line. These resulting neutrals will not be decelerated by the deceleration electric fields and may therefore reach the wafers at higher than desired energies. This effect is known as energy contamination and leads to a deeper than desired dopant depth profile. Energy contamination is only tolerable to a level of ~0.1%, depending on the energy of the neutral fraction, to provide a sufficient margin against shifts in device performance [L. Rubin, and W. Morris, "Effects of Beam Energy Purity on Junction Depths in Sub-micron Devices", Proceedings of the International Conference on Ion Implantation Technology, 1996, p96].

Reducing the beamline pressure can reduce the energy contamination but this approach requires the chamber pressures to be kept very low (5.0E-7 torr). This level of vacuum is, however, very difficult to be maintained under normal operating conditions due to the out-gassing of the photo-resist coating of patterned devices as well as the contribution from feed gases. Another issue is the variation in the level of contamination. Pressure fluctuations during the implant can cause across wafer effects. Day-to-day changes in residual vacuum or photo-resist quality may cause batch-to-batch effects. There is a potential for the loss of wafers, potentially worth millions of dollars, due to undetected vacuum problems. Methods have been invented to detect energy contamination due to high chamber pressure during ion beam deceleration [B. Adibi, U.S. Pat. No. 5,883,391: Ion Implantation Apparatus And A Method Of Monitoring High Energy Neutral Contamination In An Ion Implantation Process, 1999].

FIG. 1 is a functional block diagram for a conventional low energy ion implantation system used for generating a low energy beam 10 from an ion source 15 for carrying out a low energy ion implant on a target wafer 20. The ion beam 10 generated from the ion source 15 is mass analyzed by a magnetic analyzer 25 and travels along a curved trajectory that makes a nearly ninety-degree turn. The positively charged particles are decelerated by applying a negative voltage 30 along the ion beam path 10 for reducing the implant energy when the ion beam 10 passes through the deceleration optics 35 to reach the target wafer 20. The drawback of this system is the presence of the neutral particles, which are not decelerated by the negative voltage 30. These neutral particles will bombard the target wafer 20 at a higher energy than the decelerated charged particles and cause undesirable effects to the devices. The vacuum has to be maintained at a very high level within the sealed space by the beamline chamber 40 and the target chamber 50 to minimize the neutralization of the ion beam.

The use of plasma electron flood systems and out-gassing of photoresist wafers are two reasons why it is impractical to have a high vacuum in the chambers 40 and 50. To prevent beam blow-up after deceleration and wafer charging during implants, an electron flood source or a plasma flood source should be placed between the deceleration optics 35 and the target wafer 20. These flood sources usually require substantial gas flow, such as xenon or argon gas, for the best performance. The gas flow out of the flood source increases the gas pressure in chambers 40 and 50. Additionally, ion beam bombardment of the target wafer with patterned photoresist coating generates significant out-gassing that also contributes to an increase of the gas pressure in the chambers 40 and 50, particularly near the wafer.

For the above stated reasons, traditional techniques of ion implantation using conventional types of energy deceleration systems as described above do not provide a viable solution for the difficulties currently associated with the fabrication processes employing very low energy implantation. There is a pressing need in the art of IC device fabrication for new systems and methods used for very low energy ion implantation. Specifically, for devices that require shallow p-type and n-type junctions, new methods and systems are required to resolve these difficulties and limitations with effective control over energy contamination of low energy beams.

Separating a decelerated ion beam from neutral particles by electrostatic field has been used in nuclear fusion technology [Hashimoto et al., U.S. Pat. No. 4,480,185: Neutral Beam Injector, 1984]. Similar concept of this technology can be applied to the ion implantation technology to solve energy contamination problem during ion beam deceleration.

SUMMARY OF THE PRESENT INVENTION

It is the object of the present invention to provide a new ion implant method for low energy implantation to form shallow p-type and n-type junctions in semiconductor devices. Specifically, it is the object of the present invention to present a new ion beam steering and deceleration method for decelerating a charged ion beam and for separating the neutralized particle beam from the ion beam. The neutralized beam, which propagates at a higher energy than the decelerated ion beam, is separated and stopped by a neutral-particle-stopping block before reaching the target wafer. In this way, energy contamination as a result of neutralized particles incident to the target with higher than desired energy is resolved.

An ion implantation method is disclosed in this invention that involves an ion beam deceleration optics that includes a beam deceleration means for decelerating the ion beam for producing a low energy ion beam. The beam deceleration optics further includes a beam steering means for generating an electrostatic field for steering the ion beam to a targeted ion-beam direction and separating neutralized particles from the ion beam by allowing the neutralized particles to transmit in a neutralized-particle direction slightly different from the targeted ion-beam direction. The ion beam steering means further includes a beam stopper for blocking said neutralized particles from reaching said target of implantation that minimizes energy contamination from high energy neutralized particles.

DETAILED DESCRIPTION OF THE METHOD

Figure 1:
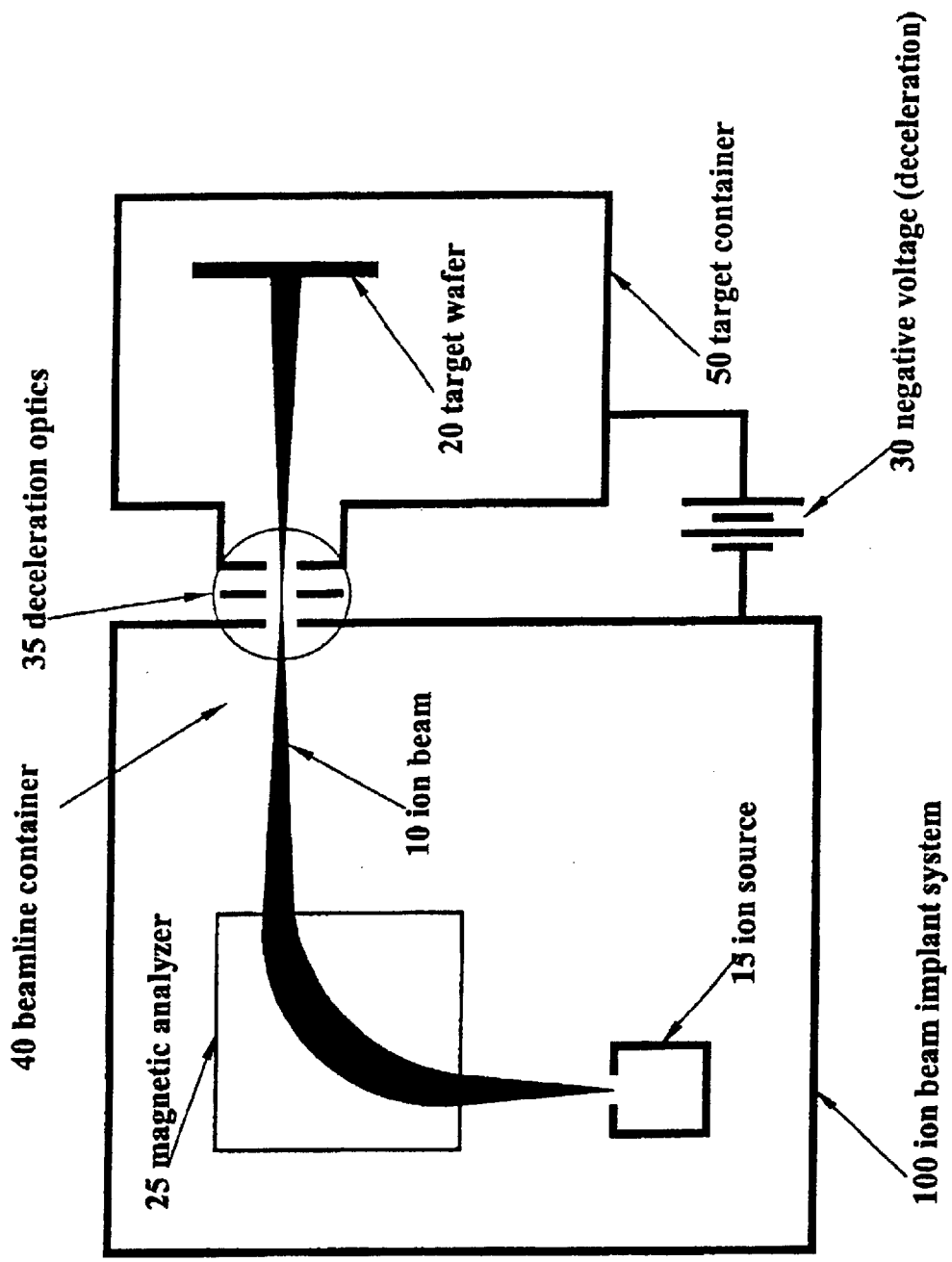
FIG. 1 is a functional block diagram of a conventional ion implantation system.
Figure 2:
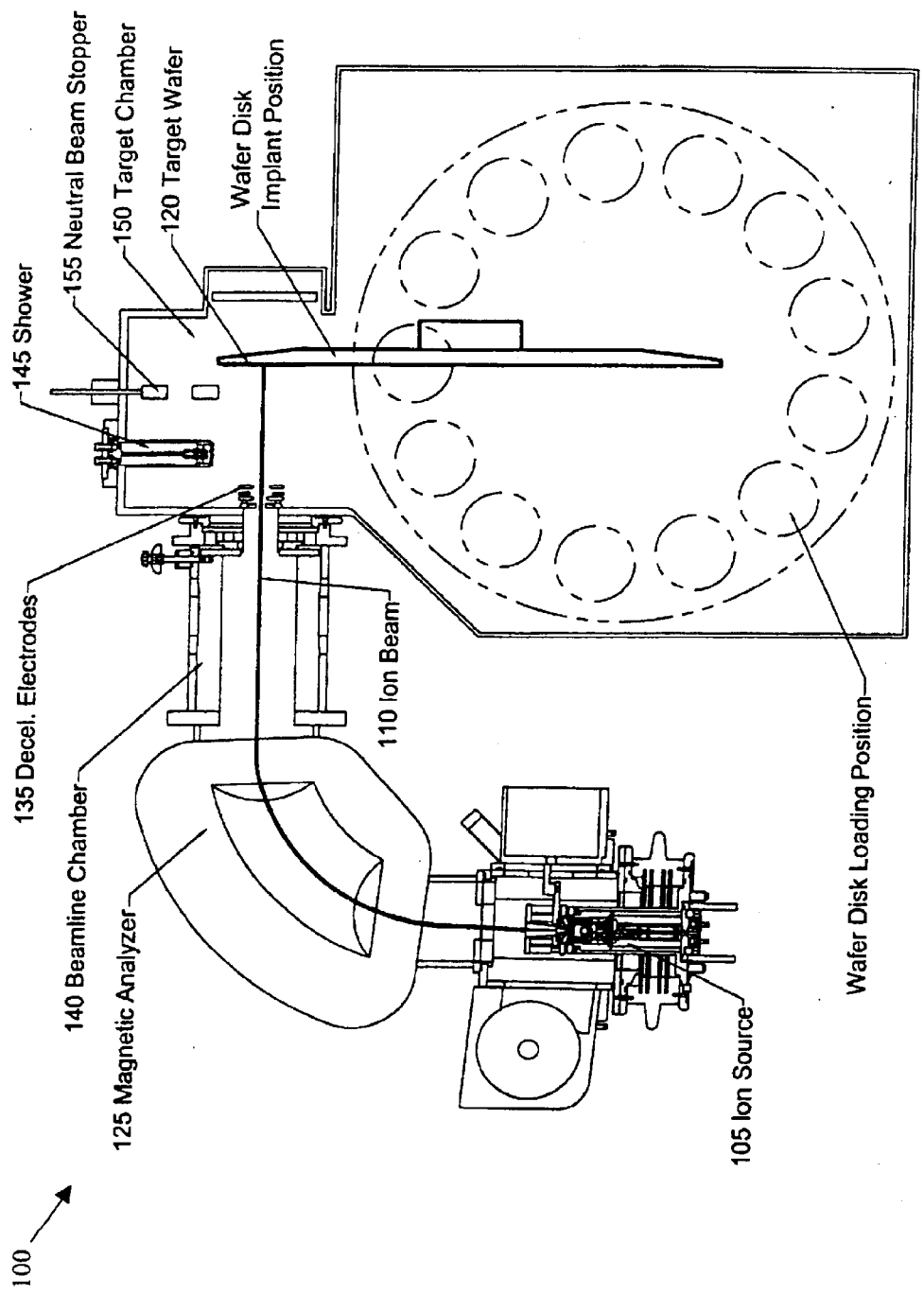
FIG. 2 is a diagram of a new implantation system of this invention under normal operation without ion beam steering.

The present invention teaches a novel low-energy ion implant method involving the separation of the charged ion beam from the uncharged neutralized particles. FIG. 2 is a diagram of the current invention. The diagram of the ion beam implant system includes the ion source 105, the mass analyzer magnet assembly 125, beamline chamber 140, post analysis deceleration electrode assembly 135, plasma shower 145, and target chamber 150 for implanting a target wafer 120 with an ion beam 110. Under normal operation, the ion beam is mass-selected and decelerated by the decel electrode assembly 135, and is transported to the target wafer 120. The plasma shower 145 helps to reduce the space charge of the decelerated ion beam 110 and increase the beam transportation efficiency from the decel electrode assembly 135 to the wafer 120. As the ion beam 110 travels through the resolving chamber 140 some charged particles may be neutralized through the process of charge exchange with residual gas in the beamline. The deceleration voltage will not decelerate these neutralized particles because they do not carry any charge. The speed and direction of the neutral particles are not affected by the electric field. When these neutral particles with higher energy reach the target wafer 120 together with the decelerated ion beam, they will cause energy contamination with deeper implant profile.

Figure 3A:
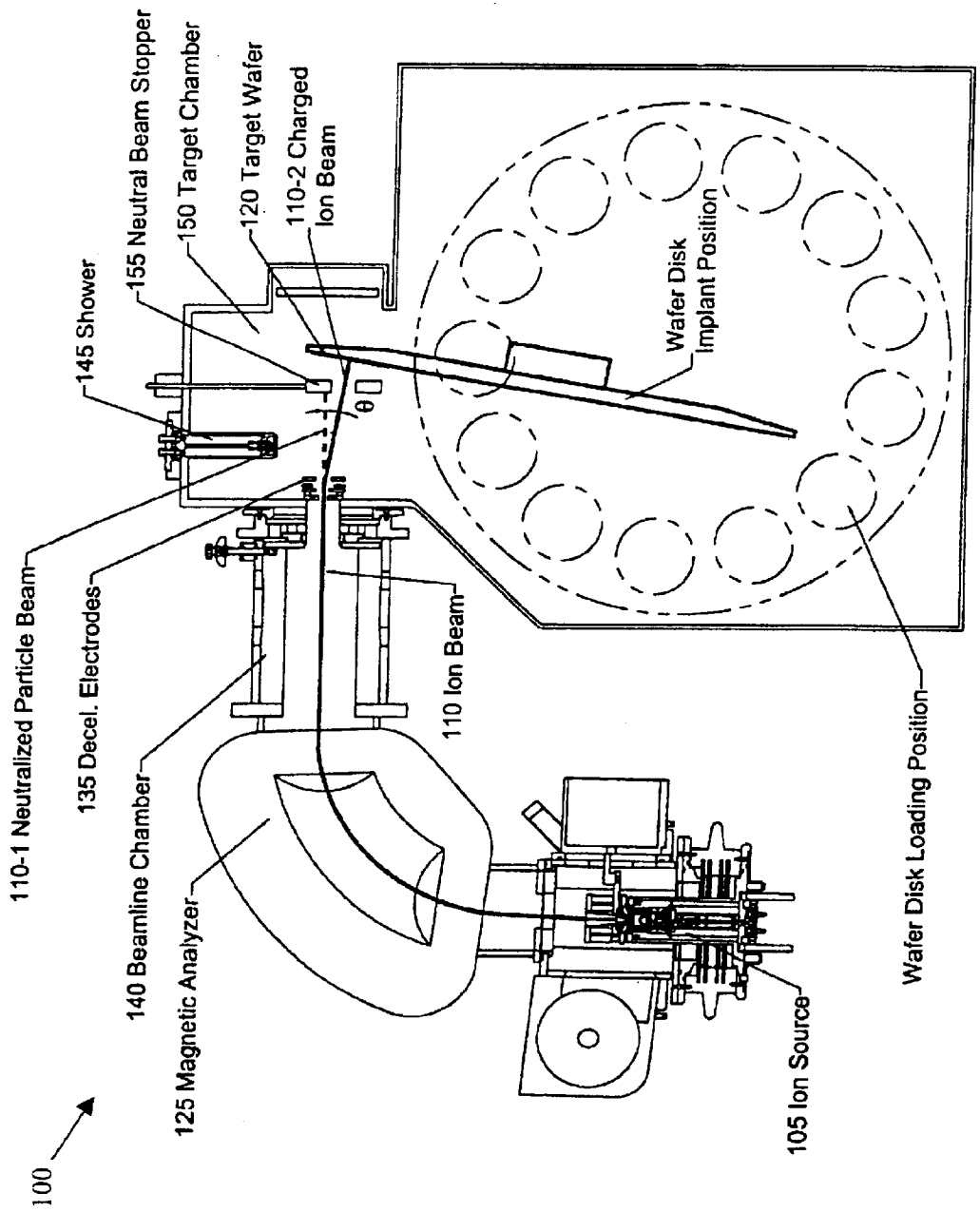
FIG. 3 is a diagram of a new implantation system of this invention with ion beam steering when the deceleration electrodes are used to steer the ion beam downward (a) or upward (b) to separate the neutral beam and the ion beam.

Separating the neutral particle beam and the ion beam to prevent the neutral beam from reaching the wafer is the most effective way to eliminate the energy contamination. In this invention, the beam is steered downward (FIG. 3a) or upward (FIG. 3b) in decel-mode by displacing one or several of the decel electrodes off the beam line symmetric axis on the dispersive plane defined by the mass analyzer magnet The non-symmetric electric field bends the ion beam with an off-axis angle as a function of the decel electrode displacements and the decel electrode voltages. After passing through the decel electrode assembly 135, the path of the neutralized particles and the charged particles are therefore separated during deceleration and become two separate beams 110-1 and 110-2. The neutralized particle beam 110-1 travels along a straight line while the charged ion beam 110-2 is travels along a path with a slightly downward (or upward) angle, in a range of three to fifteen degrees, such that the beam is directed at the target wafer 120. Note that the angle can be different depending on a particular system configuration. A beam stopper 155 is employed in the path of the neutralized particle beam 110-1 to block the neutralized beam 110-1 from reaching the target wafer 120. The target wafer 120 is tilted with a small slant angle relative to the vertical axis such that the wafer normal is parallel to the incident ion beam 110-2. The wafer is also moved downward (or upward) from the normal implant position as shown in FIG. 2 to a new position as shown in FIG. 3a (or FIG. 3b) to accept the steered ion beam.

Figure 3B:
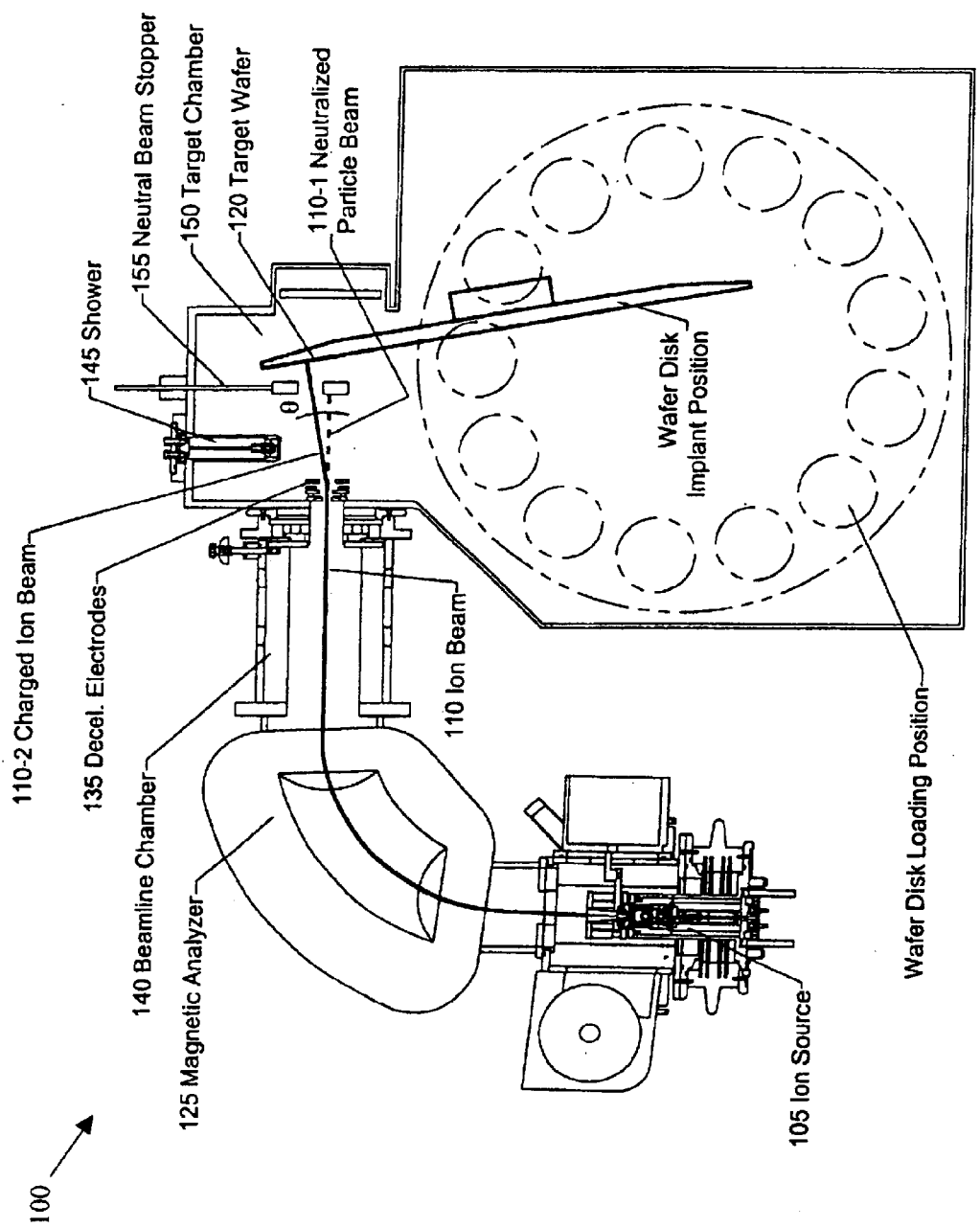

The invention discloses an ion implantation method that requires the use of a target chamber for containing a target for implantation and an ion source chamber that includes an ion source with a mass analyzer for generating an ion beam with specific mass at original energy. The ion source chamber further includes beam deceleration optics for decelerating the ion beam from the original energy to the desired final energy. The beam deceleration optics further includes an ion beam steering means for generating an electrostatic field. The electrostatic field is applied to steer the ions to the targeted ion-beam direction that is slightly different from the original ion beam direction. The targeted ion-beam direction has a small downward (or upward) angle, in a range from three to fifteen degrees, while the neutralized beam particles are unaffected by the deceleration and steering means and travel in the original beam direction. The target chamber containing the target for implantation is tilted backward (or forward), as shown in FIG. 3a and 3b, at a small angle in a range from three to fifteen degrees toward the ion-source chamber whereby the target for implantation may be perpendicular to the ion beam. A beam stopper is provided in the neutralized beam path to prevent the neutralized beam from reaching the implant target in the target chamber. The energy contamination from high-energy neutral particles is therefore eliminated regardless how many neutral particles are created from ion beam interaction with the residual gas molecules. Low energy contamination of less than 0.1% can be achieved even low vacuum environment exists in the beamline. In a specific embodiment, the ion source chamber is provided with a vacuum in the range of $10^{-5}$ Torr and the ion beam may be decelerated to an energy level as low as 200 eV with a beam energy contamination of less than 0.1%.

The original beam is required to have small beam width for separating the decelerated and steered ion beam with the neutralized beam in a position not far from the deceleration region to significantly reduce energy contamination Assume that the steering angle is $\theta_o$, the beam width is w for both the neutralized beam and decelerated ion beam, and the travel distance for completely separating the neutralized beam and the steered ion beam is L. The steering angle $\theta_o$ should be maintained small, usually from three degrees to fifteen degrees, to minimize corresponding wafer position change and possible beam current loss. The travel distance L should be short to maximize beam current delivery to the wafer when space charge blow-up occurs for low energy and high current beam. Since the relation among these parameters is approximately $w = L \tan\theta_o$, the beam width is required to be small, too. For instance, when $\theta_o$ is equal to 6 degrees and L equal 30 cm, w will become 3.2 cm.

Considering that large beam cross section is required to minimize space charge blow-up for low energy and high current beam, the beam height should be increased when the beam width is limited to be small. In other words, an ion beam with large aspect ratio (or large height-to-width ratio) is required in the deceleration and steering region for successfully separating the decelerated and steered ion beam from the neutralized beam, and transporting the production worthy low energy beam currents. An aspect ratio of 4 is considered to be the minimum requirement for separation of a low energy and high current ion beam from the corresponding neutralized beam. Since the beam width is usually larger than 25 cm, the beam height would be at least 10 cm. After the neutralized beam is separated from the decelerated ion beam, a beam stopper can be applied in the neutralized beam path to prevent the neutrals with higher energy from reaching the wafer and therefore minimize energy contamination.

For an ion source with a narrow extraction aperture, the aspect ratio of an ion beam usually decreases when the beam travels from the ion source/extraction region to the deceleration and steering region because the space charge blow-up is more severe in the dispersive plane than in the non-dispersive plane defined by the analyzer magnet To obtain an ion beam with aspect ratio larger than 4 in the deceleration and steering region, the aspect ratio of the ion source extraction aperture should be several times larger than 4. We consider that the aspect ratio of the ion source extraction aperture is at least equal to 20 to provide high aspect ratio beams in the region of deceleration and steering for successful separation of the decelerated and steered ion beam and the neutralized beam.

According to FIGS. 2 and 3, this invention discloses a method for performing an ion implantation. The method includes steps of a) providing a target chamber for containing a target for implantation and an ion source chamber including an ion source for generating an ion beam; b) providing a beam deceleration optics that includes a beam deceleration means in the ion source chamber for decelerating the ion beam for producing a low energy ion beam; c) providing a beam steering means to the beam deceleration optics to separate neutralized particles out of the ion beam by keeping the neutralized particles propagating in a neutralized-particle direction slightly different from a steered targeted ion-beam direction; and d) employing the ion-beam deceleration optics for transmitting the ion beam along the targeted ion-beam direction to the target for implantation and for blocking the neutralized particles from reaching the target for implantation. In a preferred embodiment, the method further includes a step of e) providing an analyzer magnet to the ion source chamber for mass filtering. In a preferred embodiment, the step of employing the beam deceleration means further includes a step of providing a deceleration electric-field means for generating a deceleration electric-field for decelerating the ion beam for producing a low energy ion beam. In a preferred embodiment, the step of employing the ion beam steering means for generating an electrostatic field for keeping the neutralized particle to transmit along a trajectory different than the ion beam carrying electric charges comprising a step of steering the ion beam to transmit in a targeted ion-beam direction slightly different from the neutralized-particle direction. In a preferred embodiment, the step of employing an ion-beam deceleration optics further includes a step of employing a neutralized beam blocking means for blocking the neutralized particle from reaching the target of implantation in the target chamber. In a preferred embodiment, the step of providing an ion source in an ion source chamber is a step of providing an ion source for generating a positive charged ion beam. And, the step of employing the beam deceleration means includes the step of employing a deceleration electric-field means for generating a negative electric-field for decelerating the ion beam for producing a low energy ion beam. In a preferred embodiment, the step of employing the ion beam steering means comprising a step of steering the ion beam carrying electric charges to transmit in the targeted ion-beam direction at a small deflected angle. In a preferred embodiment, the step of employing the ion beam steering means to steer the ion beam carrying electric charges to transmit in the targeted ion-beam direction comprising a step of steering the ion beam at a small deflected angle in a range of three to fifteen degrees relative to the horizontal axis. In a preferred embodiment, the step of providing the ion source in the ion source chamber comprising a step of providing the ion source chamber and the target chamber with a vacuum in the range of $10^{-5}$ Torr. And, the step of employing the ion beam deceleration means comprising a step of decelerating the ion beam to an energy level as low as about 200 eV with an energy contamination of less than about 0.1%.

In essence, this invention discloses a method for generating an implantation ion beam from an ion source projecting a plurality of ions. The method includes steps of a) employing a beam deceleration means for decelerating the ions projected from the ion source; b) employing a beam steering means for generating an electrostatic field for separating a plurality of neutralized particles from the ion ions by keeping the neutralized particles propagating in a neutralized-particle direction slightly different from a targeted ion-beam direction of the ions. In a preferred embodiment, the method further includes a step c) arranging a wafer implant position corresponding to the targeted ion-beam direction for accepting the ions projected thereto. In a preferred embodiment, the step of employing a means for transmitting the ions to a target of implantation comprising a step of employing a means for blocking the neutralized particles from reaching the target of implantation. In a preferred embodiment, the step of separating the neutralized particles from the ions comprising a step of providing a charged particle deflection means for deflecting the trajectory of the ions at a small angle from the trajectory of the neutralized particles. In a preferred embodiment, the method further comprising a step of configuring the ion beam deceleration means for decelerating and processing the ions into an ion beam having a large beam-height to beam-width ratio. In another preferred embodiment, the method further comprising a step of providing a beam block for blocking the neutralized particles propagating in the neutralized-particle direction. In a preferred embodiment, the method further includes a step of projecting the ions in forming the implantation ion beam with high beam current and low and a ratio of a beam height to a beam width equal or larger than 20. In another preferred embodiment, the step of forming the implantation ion beam having a ratio of a beam height to a height to a beam width equal or larger than 20 comprising a step of providing an extraction aperture for the ion source with an aspect ratio equal or larger than 20. In another preferred embodiment, the step of configuring the ion beam deceleration means for decelerating and processing the ions into an ion beam having a large beam-height to beam-width ratio comprising a step of processing the ions into an ion beam having a beam-height to beam-width ratio equal or greater than 4. And, the step of processing the ions into an ion beam having a beam-height to beam-width ratio equal or greater than 4 comprising a step of providing an aperture of a deceleration and steering optics having a beam-height to beam-width ratio equal or greater than 4. In a preferred embodiment, the step of providing a charged particle deflection means for deflecting the trajectory of the ions at a small angle from the trajectory of the neutralized particles comprising a step of deflecting the trajectory of the ions at an angle in the range of three to fifteen degrees.

Therefore, the present invention provides a new low energy implant method used to form shallow p-type and n-type junctions in semiconductor devices. Specifically, a new ion beam deceleration method is disclosed for decelerating a charged ion beam and for separating a neutralized beam from the ion beam. The neutral beam is composed of neutral particles propagating at energies higher than the desired energy. The neutral beam is separated and stopped by a neutral-particle-stopping block so that it is unable to reach the target wafer. The problem of energy contamination in very low energy implants using decel-mode is thus resolved using this invention.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for performing an ion implantation comprising:
   providing a target chamber for containing a target for implantation and an ion source chamber including an ion source for generating an ion beam;
   disposing right in front of said target a beam deceleration optics that includes means for generating an off-axis electric field for decelerating and deflecting charged particles in a vertically spread beam of said ion beam to project toward said target along a deflected angle away from neutralized particles in said ion beam.

2. The method of performing an ion implantation of claim 1 wherein:
   disposing an analyzer magnet right at an exit of said ion source chamber for mass filtering said ion beam.

3. The method of performing an ion implantation of claim 1 wherein:
   said step of disposing said deceleration optics further comprising a step of disposing electrodes right in front of said target chamber for generating said off-axis electrical field for decelerating and deflecting said charged particles in said vertically spread beam of said ion beam.

4. The method of performing an ion implantation of claim 1 further comprising:
   disposing said target on a target support and disposing said target support at an inclined angle whereby said target is substantially perpendicular to a projection direction of said charged particles projected along said deflected angle.

5. The method of performing an ion implantation of claim 1 further comprising:
   disposing a neutralized beam blocking means between said deceleration optics and said target for blocking said neutralized particle from reaching said target.

6. The method of performing an ion implantation of claim 1 wherein:
   said step of providing an ion source in an ion source chamber is a step of providing an ion source for generating a positive charged ion beam; and
   said step of disposing said beam deceleration optics includes a step of disposing a means for generating a negative off-axis electric-field for decelerating and deflecting said charged particles in said ion beam as said vertically spread beam.

7. The method of performing an ion implantation of claim 1 wherein:
   said step of generating said off-axis electrical field for decelerating and deflecting said charged particles in said ion beam as said vertically spread beam is a step of deflecting said charged particles at a small deflected angle relative to a projected direction of neutralized particles.

8. The method of performing an ion implantation of claim 7 wherein:
   said step of decelerating and deflection said charged particles in said ion beam as said vertically spread beam comprising a step of deflecting said charged particles at a small deflected angle in a range of three to fifteen degrees relative to a projection direction of said neutralized particles.

9. The method of performing an ion implantation of claim 1 wherein:
   said step of providing said ion source in said ion source chamber comprising a step of providing said ion source chamber and said target chamber with a vacuum of approximately $10^{-5}$ Torr; and
   said step of decelerating and deflecting said charged particles is a step of decelerating said charged particles in said ion beam to an energy level as low as about 200 eV with an energy contamination of less than about 0.1%.

10. A method for generating an implantation ion beam from an ion source projecting a plurality of ions comprising:
    disposing a beam deceleration means right in front of a target wafer of implantation for decelerating and deflecting charged particles in said ion beam as a vertically spread beam away from neutralized particles in said ion beam to project decelerated and deflected charged particles to said target wafer of implantation.

11. The method of claim 10 further comprising:
    arranging a wafer implant position with a small inclined angle relative to a projection direction of said neutralized particles corresponding to and substantially perpendicular to a projection direction of said charged particles for accepting said charged particles projected thereto.

12. The method of claim 10 further comprising:
    disposing a blocking means between said decelerating means and said target wafer for blocking said neutralized particles from reaching said target wafer of implantation.

13. The method of claim 10 wherein:
    said step of disposing said decelerating means further comprising a step of disposing electrodes right in front of said target for generating an off-axis electric field for decelerating and deflecting said charged particles away from neutralized particles in said ion beam.

14. The method of claim 13 wherein:
    said step of deflecting said charged particles away from neutralized particles comprising a step of deflecting said charged particles to project at an angle in a range of three to fifteen degrees relative to a projection direction of said neutralized particles.

15. The method of claim 10 wherein:

said step of decelerating and deflecting said charged particles away from neutralized particles in said ion beam further comprising a step of decelerating and deflecting said charged particles into a high-aspect ratio beam having a beam-height to beam-width ratio ranging substantially between 4 and 20.

16. The method of claim 10 further comprising:

disposing a beam block between said deceleration means and said target wafer for blocking said neutralized particles.

17. The method of claim 10 wherein:

said step of decelerating and deflecting said charged particles away from neutralized particles in said ion beam further comprising a step of decelerating and deflecting said charged particles into a high-aspect ratio beam having a ratio of a beam height to a beam width ranging substantially between 4 and 20.

18. The method of claim 17 wherein:

said step of deflecting said charged particles into a high aspect-ration beam comprising a step of providing an extraction aperture for said ion source with an aspect ratio ranging substantially between 4 and 20.

19. The method of claim 17 wherein:

said step of deflecting said charged particles into a high aspect ratio beam comprising a step of deflecting said charged particles into an ion beam having a beam-height to beam-width ratio equal or greater than 4.

20. The method of claim 19 wherein:

said step of deflecting said charged particles into an ion beam having a beam-height to beam-width ratio equal or greater than 4 comprising a step of providing an aperture to said beam deceleration means wherein said aperture having a beam-height to beam-width ratio equal or greater than 4.

* * * * *